(12) United States Patent
Wen et al.

(10) Patent No.: US 10,984,693 B2
(45) Date of Patent: Apr. 20, 2021

(54) DISPLAY DEVICE AND SHUTDOWN CONTROL METHOD THEREOF

(71) Applicant: Au Optronics Corporation, Hsinchu (TW)

(72) Inventors: Chun-Kuei Wen, Hsinchu (TW); Hung-Min Shih, Changhua County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/357,332

(22) Filed: Mar. 19, 2019

(65) Prior Publication Data

US 2019/0295451 A1  Sep. 26, 2019

(30) Foreign Application Priority Data

Mar. 23, 2018  (TW) .................................. 107109957

(51) Int. Cl.
*G09G 5/00* (2006.01)
*G09G 3/20* (2006.01)
(Continued)

(52) U.S. Cl.
CPC ....... *G09G 3/20* (2013.01); *G09G 2310/0291* (2013.01); *G09G 2310/0297* (2013.01); *G09G 2320/0247* (2013.01); *G09G 2330/027* (2013.01); *H03K 3/037* (2013.01); *H03K 19/018521* (2013.01)

(58) Field of Classification Search
CPC ............... G09G 3/3696; G09G 3/3688; G09G 2310/0291; G09G 2310/0297; G09G 2320/0247; G09G 2330/027; G09G 2300/043; G09G 3/3648; G09G 3/3655;
(Continued)

(56) References Cited

U.S. PATENT DOCUMENTS 9,293,094 B2  3/2016 Morii et al.
9,570,030 B2  2/2017 Iwamoto et al.
(Continued)

FOREIGN PATENT DOCUMENTS

CN   103620760   3/2014
CN   104167190   11/2014
(Continued)

*Primary Examiner* — Jennifer T Nguyen
(74) *Attorney, Agent, or Firm* — JCIPRNET

(57) ABSTRACT

A display device and a shutdown control method thereof are provided. In the display device, a display panel has multiple pixels. A power supply circuit generates a power supply voltage, a gate high voltage and a common voltage according to an input power. A gate driver generates gate scan signals, and a source driver provides source driving signals to drive the display panel. A shutdown detection circuit detects a variation state of voltages values of the power supply voltage, the input voltage and the gate high voltage, and starts a shutdown process when the variation state is a decreasing state. In the shutdown process, the source driver makes the source driving signals to be equal to a reference ground voltage, the gate driver generates the gate scan signals with a high voltage pulse, and the power supply circuit makes the common voltage to be equal to the reference ground voltage.

15 Claims, 5 Drawing Sheets

(51) Int. Cl.
    *H03K 3/037*     (2006.01)
    *H03K 19/0185*     (2006.01)

(58) Field of Classification Search
    CPC ..... G09G 2320/0257; G09G 2330/026; H03K 3/037; H03K 19/018521
    USPC .......................................... 345/213; 713/300
    See application file for complete search history.

(56) References Cited

U.S. PATENT DOCUMENTS

| | | | |
|---|---|---|---|
| 9,632,374 | B2 | 4/2017 | Murakami |
| 9,767,758 | B2 | 9/2017 | Sun et al. |
| 10,008,173 | B2 | 6/2018 | Wei et al. |
| 2005/0248381 | A1 | 11/2005 | Kubota et al. |
| 2007/0285363 | A1* | 12/2007 | Do .................. G09G 3/3655 345/87 |
| 2008/0129903 | A1 | 6/2008 | Hong et al. |
| 2010/0001801 | A1* | 1/2010 | Kim ................ H03F 1/3241 330/293 |
| 2011/0102405 | A1* | 5/2011 | Harada ............ G09G 3/3655 345/211 |
| 2014/0146426 | A1 | 5/2014 | Murakami |
| 2014/0191935 | A1 | 7/2014 | Morii et al. |
| 2014/0340382 | A1 | 11/2014 | Sawabe et al. |
| 2015/0269900 | A1* | 9/2015 | Iwamoto ........... G09G 3/3648 345/100 |
| 2016/0365056 | A1* | 12/2016 | Sun .................. G09G 3/3648 |
| 2017/0092218 | A1 | 3/2017 | Wei et al. |

FOREIGN PATENT DOCUMENTS

| | | |
|---|---|---|
| CN | 104361866 | 2/2015 |
| CN | 103703507 | 4/2016 |
| CN | 104718568 | 6/2017 |
| TW | I375202 | 10/2012 |
| TW | I562126 | 12/2016 |
| TW | I619106 | 3/2018 |

\* cited by examiner

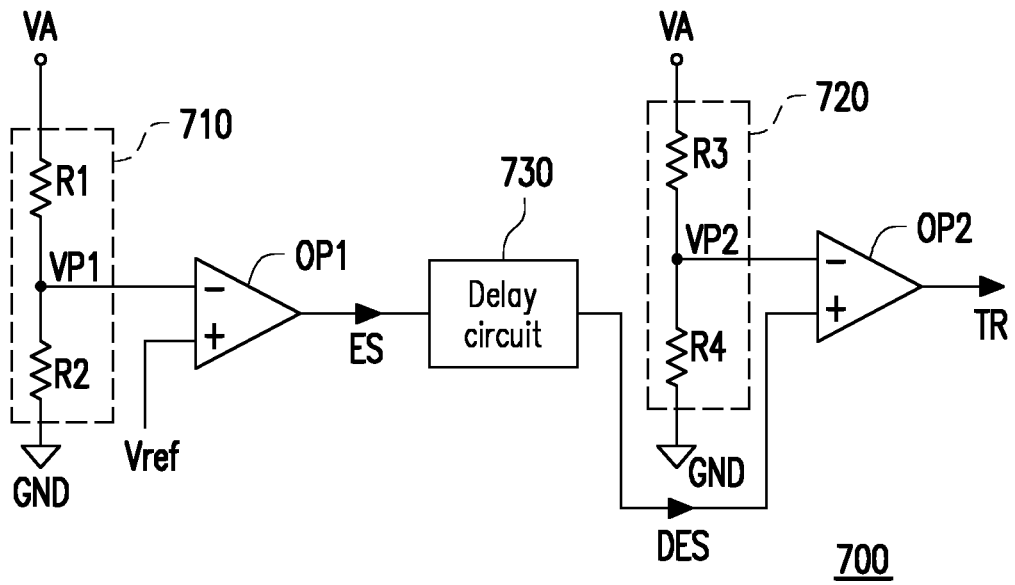

FIG. 7

```
┌─────────────────────────────┐
│ Detect a variation state of │
│ voltage values of a power   │
│ supply voltage, an input    │
│ voltage and a gate high     │──S810
│ voltage, and start a        │
│ shutdown process when the   │
│ voltage values of the power │
│ supply voltage, the input   │
│ power and the gate high     │
│ voltage are all in a        │
│ decrease state              │
└─────────────────────────────┘
              │
              ▼
┌─────────────────────────────┐
│ In the shutdown process,    │
│ make source driving signals │
│ to be equal to a reference  │
│ ground voltage, generate    │──S820
│ each of gate scan signals   │
│ with a high voltage pulse,  │
│ and make a common voltage   │
│ to be equal to the          │
│ reference ground voltage    │
└─────────────────────────────┘
```

FIG. 8

DISPLAY DEVICE AND SHUTDOWN CONTROL METHOD THEREOF

CROSS-REFERENCE TO RELATED APPLICATION

This application claims the priority benefit of Taiwan application serial no. 107109957, filed on Mar. 23, 2018. The entirety of the above-mentioned patent application is hereby incorporated by reference herein and made a part of this specification.

BACKGROUND OF THE INVENTION

Field of the Invention

The invention relates to a display device and a shutdown control method thereof, and particularly relates to a display device adapted to execute a pixel charge discharging operation in a shutdown process and a shutdown control method thereof.

Description of Related Art

Along with development of technology, consumer electronics products have become indispensible tools in people's daily life. In order to provide a good human-machine interface, it is a common trend to configure a high quality display device to the consumer electronics product.

In the conventional display device, a charge-discharge characteristic of pixels generally influences display quality of a display image presented by a display panel. It should be noted that when a user wants to perform a shutdown operation to the display device, if the pixels are not discharged through a related discharge mechanism of the display device, the pixels may store residual charges. In this case, when the display device is again turned on, the display image presented by the display panel is influenced by the aforementioned residual charges to cause a flickering phenomenon, such that the quality of the display image is decreased.

SUMMARY OF THE INVENTION

The invention is directed to a display device and a shutdown control method thereof, which are adapted to effectively improve display quality of the display device.

The invention provides a display device including a display panel, a power supply circuit, a gate driver, a source driver and a shutdown detection circuit. The display panel has a plurality of pixels, and receives a common voltage. The power supply circuit receives an input power, and generates a power supply voltage, a gate high voltage and the common voltage according to the input power. The gate driver is coupled to the display panel, and receives the gate high voltage to generate a plurality of gate scan signals to drive the display panel. The source driver is coupled to the display panel, and provides a plurality of source driving signals to drive the display panel. The shutdown detection circuit is coupled to the power supply circuit, the gate driver and the source driver, and is configured to detect a variation state of voltage values of the power supply voltage, the input power and the gate high voltage, and start a shutdown process when the voltage values of the power supply voltage, the input power and the gate high voltage are all in a decreasing state. In the shutdown process, the source driver makes the source driving signals to be equal to a reference ground voltage, the gate driver generates the gate scan signals with a high voltage pulse, and the power supply circuit makes the common voltage to be equal to the reference ground voltage.

The invention provides a shutdown control method including: detecting a variation state of voltage values of a power supply voltage, an input voltage and a gate high voltage, and starting a shutdown process when the voltage values of the power supply voltage, the input power and the gate high voltage are all in a decreasing state; in the shutdown process, making source driving signals to be equal to a reference ground voltage, generating each of gate scan signals with a high voltage pulse, and making a common voltage to be equal to the reference ground voltage, where the power supply voltage, the gate high voltage and the common voltage are generated according to the input power.

Based on the above description, the display device of the invention uses the shutdown detection circuit to detect the variation state of the voltage values of the power supply voltage, the input power and the gate high voltage, and starts the shutdown process when the voltage values of the power supply voltage, the input power and the gate high voltage are all in the decreasing state. In this way, the display device of the invention is adapted to further discharges the pixels in the display panel according to operation steps of the shutdown process, such that the residual charges stored in the pixels may be discharged to the reference ground voltage, so as to improve the display quality of the display panel.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 is a circuit diagram of a voltage detection circuit according to an embodiment of the invention.

FIG. 8 is a flowchart illustrating a shutdown control method of a display device according to an embodiment of the invention.

DESCRIPTION OF EMBODIMENTS

Figure 1:
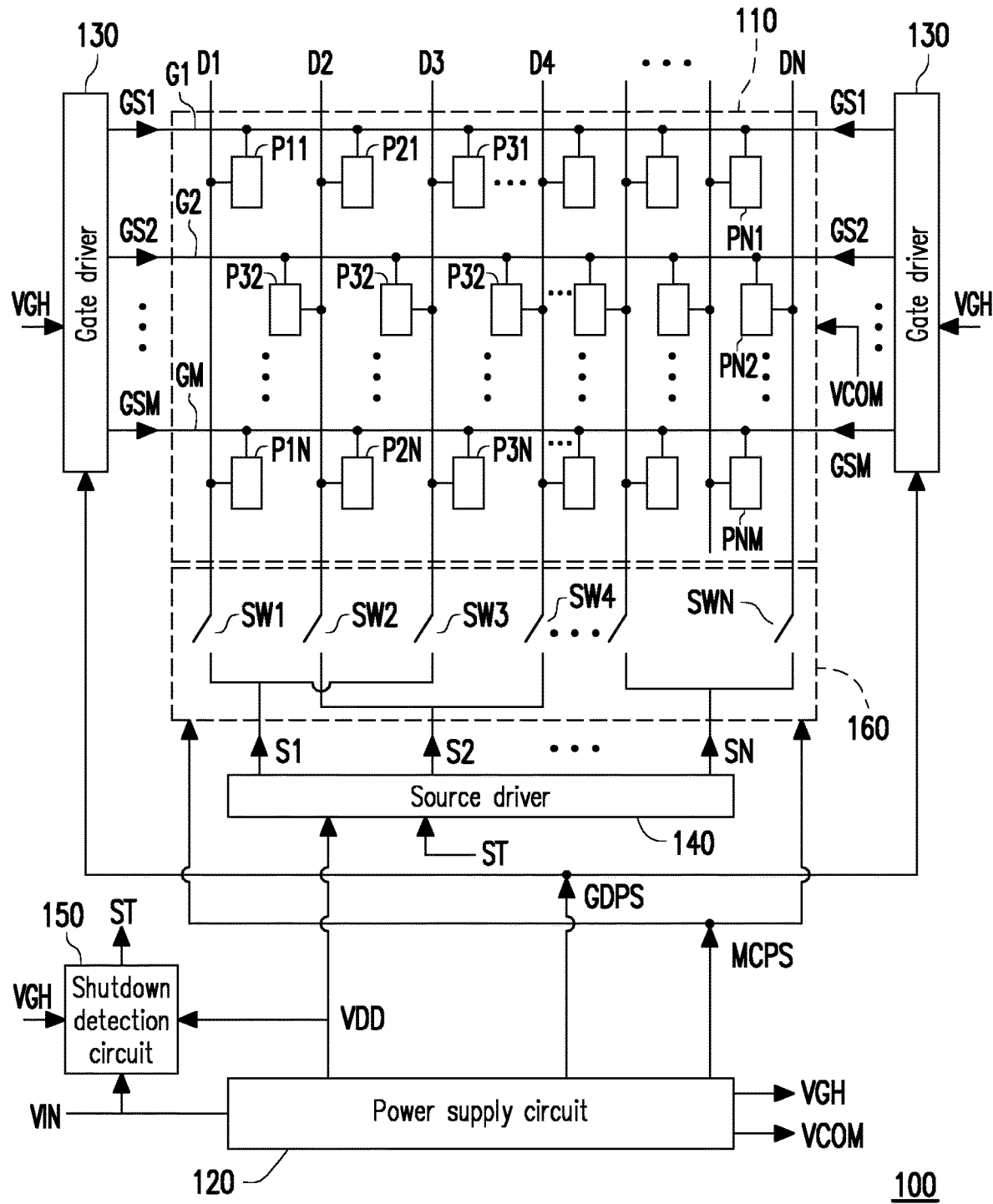
FIG. 1 is a schematic diagram of a display device according to an embodiment of the invention.

FIG. 1 is a schematic diagram of a display device according to an embodiment of the invention. Referring to FIG. 1, the display device 100 includes a display panel 110, a power supply circuit 120, a gate driver 130, a source driver 140 and a shutdown detection circuit 150. In the present embodiment, the display panel 110 has a plurality of pixels P11-

PNM, and the display panel 110 receives a common voltage VCOM. It should be noted that the pixels P11-PNM in the display panel 110 may be arranged in a matrix, and are respectively coupled to corresponding source lines D1-DN and gate lines G1-GM. It should be noted that a designer may determine the numbers of the pixels P11-PNM, the gate lines G1-GM and the source lines D1-DN in the display panel 110 according to an actual design requirement of the display device 100, where N, M are positive integers.

On the other hand, in the present embodiment, the power supply circuit 120 may receive an input power VIN, and the power supply circuit 120 generates a power supply voltage VDD, a gate high voltage VGH and the common voltage VCOM according to the input power VIN. Moreover, in the present embodiment, the gate driver 130 is coupled to the display panel 110, and the gate driver 130 may generate a plurality of gate scan signals GS1-GSM to drive the pixels P11-PNM according to the gate high voltage VGH. Besides, the source driver 140 of the present embodiment is coupled to the display panel 110, and the source driver 140 may provide source driving signals S1-SN to drive the display panel 110.

A multiplexer 160 of the embodiment has a plurality of switches SW1-SWN. Moreover, the multiplexer 160 may be disposed on the display panel 110 and coupled to the source driver 140, and in other embodiments of the invention, the multiplexer 160 may be disposed on the source driver 140. On the other hand, the shutdown detection circuit 150 of the embodiment is coupled to the power supply circuit 120, the gate driver 130 and the source driver 140. The shutdown detection circuit 150 detects a variation state of voltage values of the input power VIN, the power supply voltage VDD and the gate high voltage VGH to determine whether to start a shutdown process or not. In detail, when the shutdown detection circuit 150 detects that the input power VIN, the power supply voltage VDD and the gate high voltage VGH are all in a decreasing state, the shutdown detection circuit 150 starts the shutdown process.

Further, when the shutdown process is started, the source driver 140 sets the source driving signals S1-SN to be equal to a reference ground voltage. Moreover, the gate driver 130 generates the gate scan signal GS1-GSM with a high voltage pulse, and transmits the gate scan signal GS1-GSM to the corresponding pixels P11-PNM, such that pixel transistors (not shown) in each of the pixels P11-PNM may be turned on. Moreover, the power supply circuit 120 sets the provided common voltage VCOM to be equal to the reference ground voltage. In this way, under an operation sequence of the shutdown process of the embodiment, the charges stored in each of the pixels P11-PNM may be discharged to supply terminals of the source driving signals S1-SN that is equal to the reference ground voltage through the turned on pixel transistors, such that when the display device 100 is turned off, the residual charges in the pixels P11-PNM may be effectively discharged. In this way, when the display panel 110 is turned on again, the image flickering phenomenon is avoided, so as to effectively improve the display quality of the display panel 110.

It should be noted that regarding the gate scan signal GS1-GSM with the high voltage pulse produced by the gate driver 130, the high voltage pulse has a predetermined pulse width. A magnitude of the pulse width may be set according to a time required for the discharge operation of the charges of the pixels P11-PNM, which is not particularly specified. Moreover, when the shutdown detection circuit 150 is operated in the shutdown process, the power supply circuit 120 of the present embodiment transmits a multiplex control pulse signal MCPS to keep the switches SW1-SWN to be in a complete turn-on state, such that each of the pixels P11-PNM may successfully perform the discharge operation.

Figure 2:
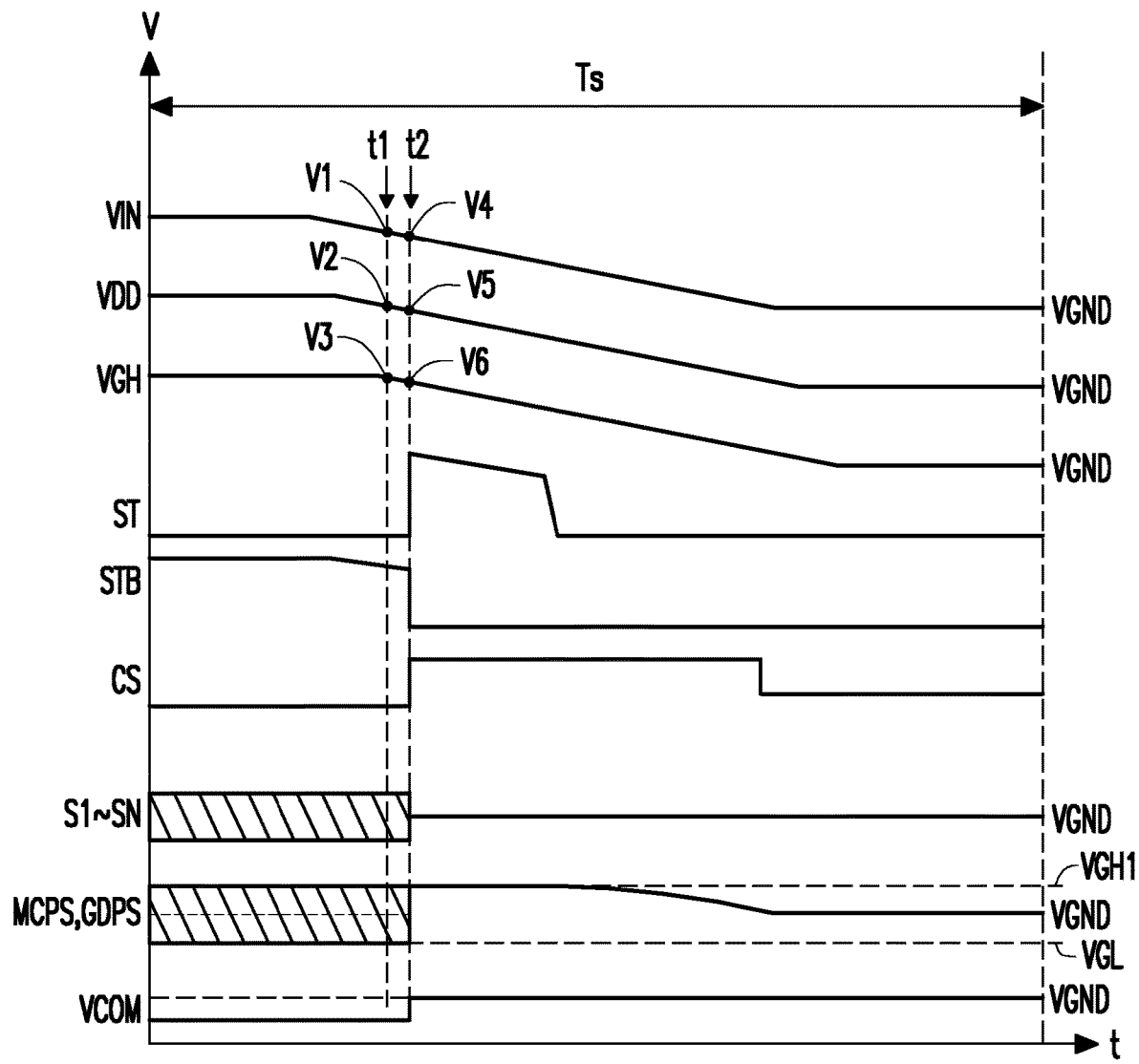
FIG. 2 is a waveform diagram of a display device according to an embodiment of the invention.

FIG. 2 is a waveform diagram of a display device according to an embodiment of the invention. In FIG. 2, a horizontal axis represents an operation time of the display device 100, and a horizontal axis represents voltage values. Referring to FIG. 1 and FIG. 2 for an operation detail of the shutdown detection circuit 150, when the display device 100 is operated in a time interval Ts, the shutdown detection circuit 150 may detect a variation state of the voltage values of the input power VIN, the power supply voltage VDD and the gate high voltage VGH. In detail, at a time point t1, the shutdown detection circuit 150 detects voltage states of the input power VIN, the power supply voltage VDD and the gate high voltage VGH at the time point t1 to respectively obtain voltage values of a corresponding voltage V1, a voltage V2 and a voltage V3 at the time point t1. The shutdown detection circuit 150 determines that the voltage values of the voltage V1, the voltage V2 and the voltage V3 are respectively smaller than standard voltage values of the input power VIN, the power supply voltage VDD and the gate high voltage VGH, which represents that the input power VIN, the power supply voltage VDD and the gate high voltage VGH are all in a decreasing state at the time point t1. Then, at a time point t2 after the time point t1, the shutdown detection circuit 150 detects voltage states of the input power VIN, the power supply voltage VDD and the gate high voltage VGH at the time point t2 to respectively obtain voltage values of a corresponding voltage V4, a voltage V5 and a voltage V6 at the time point t2. Then, the shutdown detection circuit 150 respectively compares the voltage values of the voltage V1, the voltage V2 and the voltage V3 detected at the time point t1 with the voltage values of the voltage V4, the voltage V5 and the voltage V6 detected at the time point t2 (for example, to respectively subtract the voltage values of the voltage V1, the voltage V2 and the voltage V3 by the voltage values of the voltage V4, the voltage V5 and the voltage V6) to obtain the variation state of the input power VIN, the power supply voltage VDD and the gate high voltage VGH.

To be specific, when the shutdown detection circuit 150 respectively subtracts the voltage values of the voltage V1, the voltage V2 and the voltage V3 detected at the time point t1 by the voltage values of the voltage V4, the voltage V5 and the voltage V6 detected at the time point t2, the shutdown detection circuit 150 respectively generates a corresponding voltage difference VD1, a voltage difference VD2 and a voltage difference VD3 according to the above subtraction results. For example, at the time point t1 and the time point t2, a difference between the voltage V1 and the voltage V4 respectively corresponding to the input power VIN may be represented as the voltage difference VD1. A difference between the voltage V2 and the voltage V5 respectively corresponding to the power supply voltage VDD may be represented as the voltage difference VD2. A difference between the voltage V3 and the voltage V6 respectively corresponding to the gate high voltage VGH may be represented as the voltage difference VD3.

Further, in the present embodiment, when the shutdown detection circuit 150 simultaneously detects that the voltage difference VD1 is greater than a threshold Vt1, the voltage difference VD2 is greater than a threshold Vt2, and the voltage difference VD3 is greater than a threshold Vt3, it represents that the display device 100 reaches a standard for executing the shutdown process, and the shutdown detection circuit 150 generate a start signal ST to start the shutdown process.

In detail, as shown in FIG. 1 and FIG. 2, in a time interval (between the time points t1 and t2), when the shutdown detection circuit 150 detects that the voltage values of the input power VIN, the power supply voltage VDD and the gate high voltage VGH are all in the decreasing state, the shutdown detection circuit 150 may enable the start signal ST (for example, to have a logic high level). Meanwhile, the source driver 140 sets the source driving signals S1-SN to be equal to the reference ground voltage VGND according to the start signal ST. The gate driver 130 provides the gate scan signals GS1-GSM having the high voltage pulse, and the power supply circuit 120 sets the provided common voltage VCOM to be equal to the reference ground voltage VGND, such that the pixels P11-PNM may perform the discharge operation. It should be noted that in the present embodiment, each of the thresholds Vt1-Vt3 may be determined by the designer, and the time point t1 is before the time point t2.

Figure 3:
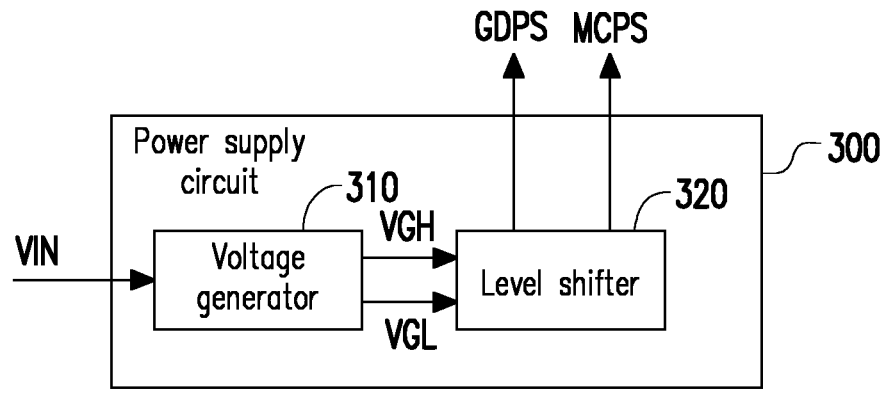
FIG. 3 is a block diagram of a power supply circuit according to an embodiment of the invention.

FIG. 3 is a block diagram of a power supply circuit according to an embodiment of the invention. The power supply circuit 300 includes a voltage generator 310 and a level shifter 320. The power supply circuit 300 may receive the input power VIN, and generate the gate high voltage VGH and a gate low voltage VGL according to the input power VIN. On the other hand, the level shifter 320 is coupled to the voltage generator 310. Moreover, the level shifter 320 may receive the gate high voltage VGH and the gate low voltage VGL to generate a gate driving pulse signal GDPS and the multiplex control pulse signal MCPS. It should be noted that the level shifter 320 of the embodiment may provide the gate driving pulse signal GDPS to the gate driver 130 to serve as a start pulse of the scan operation of the gate driver 130. Moreover, the level shifter 320 may also provide the multiplex control pulse signal MCPS to the multiplexer 160 for turning on/off the switches therein. Particularly, as shown in FIG. 1 and FIG. 2, in a time interval after the time point t2, the level shifter 320 may generate the multiplex control pulse signal MCPS and the gate driving pulse signal GDPS substantially equal to a gate high voltage VGH1, such that in the shutdown process, the switches SW1-SWN in the multiplexer 160 and the pixel switches of the pixels P11-PNM may be kept in the complete turn-on state. It should be noted that the above gate high voltage VGH1 may be decreased to the reference ground voltage VGND along with increase of an operation time of the display device.

Figure 4:
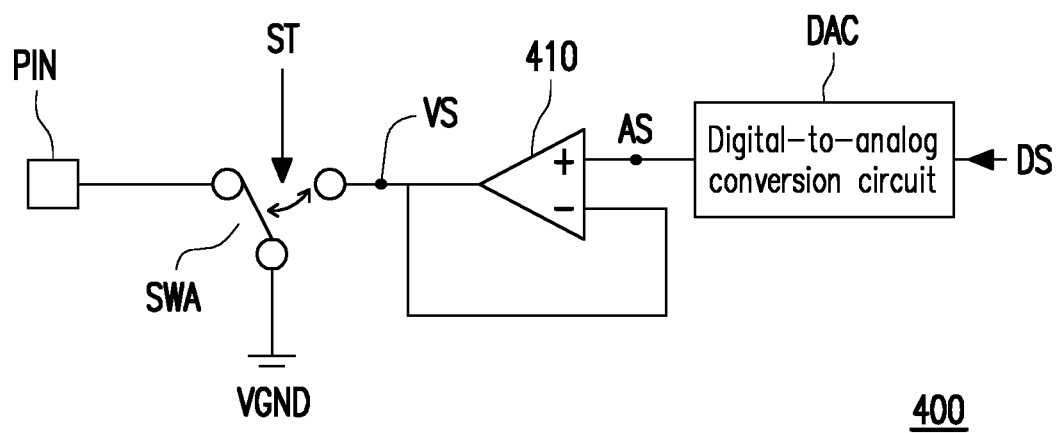
FIG. 4 is a schematic diagram of a power supply circuit according to an embodiment of the invention.

FIG. 4 is a schematic diagram of a power supply circuit according to an embodiment of the invention. In the present embodiment, the power supply circuit 400 includes a common voltage generator 410, a switch SWA and a digital-to-analog conversion circuit DAC. A first terminal of the digital-to-analog conversion circuit DAC may receive a digital signal DS, and a second terminal of the digital-to-analog conversion circuit DAC may be coupled to a positive input terminal of the common voltage generator 410. Moreover, the common voltage generator 410 has an output terminal to generate a supply voltage VS. Moreover, a negative input terminal of the common voltage generator 410 is coupled to the output terminal of the common voltage generator 410, where the common voltage generator 410 of the embodiment is a voltage follower, though the invention is not limited thereto.

On the other hand, the switch SWA of the embodiment is coupled between the output terminal of the common voltage generator 410, a common voltage output pin PIN and the reference ground voltage VGND, and the switch SWA may be controlled by the start signal ST provided by the shutdown detection circuit 150. The common voltage output pin PIN of the embodiment is used for providing the common voltage to the display panel.

In detail, the digital single DS may be converted into an analog signal AS through the digital-to-analog conversion circuit DAC. Moreover, the common voltage generator 410 may generate the supply voltage VS according to the analog signal AS. It should be noted that in the embodiment, when the shutdown process of the embodiment is started, the switch SWA makes the common voltage output pin PIN to be coupled to the reference ground voltage VGND according to the start signal ST, and makes the common voltage received by the display panel to be equal to the reference ground voltage VGND. Comparatively, in a process other than the shutdown process, the switch SWA may make the common voltage output pin PIN to receive the supply voltage VS according to the start signal ST, and provide the reference ground voltage VGND equal to the supply voltage VS to the display panel.

Figure 5:
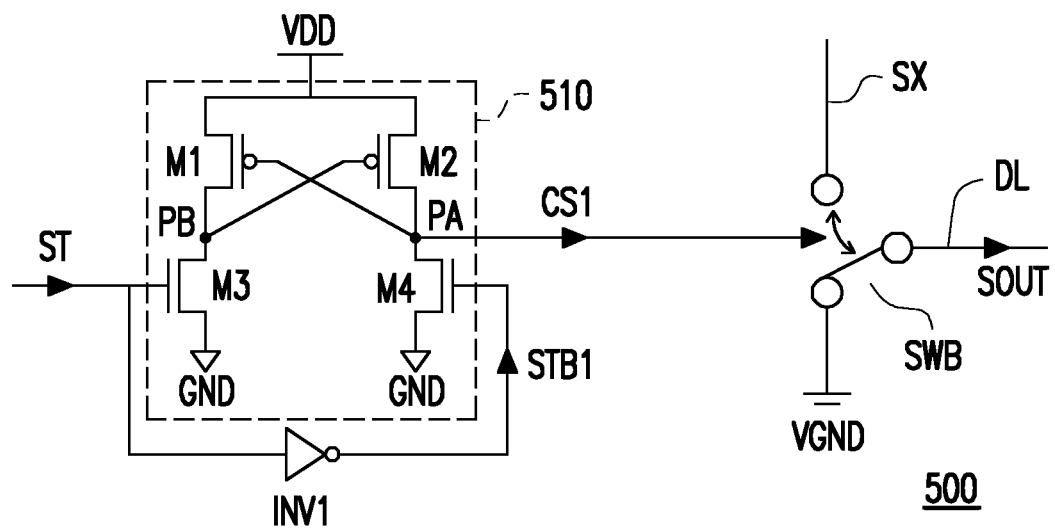
FIG. 5 is a circuit diagram of a source driver according to an embodiment of the invention.

FIG. 5 is a circuit diagram of a source driver according to an embodiment of the invention. In FIG. 5, the source driver 500 may be an implementation of the source driver 140 of FIG. 1. In the present embodiment, the source driver 500 includes a sensing circuit 510 and a switch SWB, where the sensing circuit 510 is composed of transistors M1-M4. The transistor M1 is coupled between the power supply voltage VDD and the transistor M3, and a control terminal of the transistor M1 is coupled to a node PA. The transistor M2 is coupled between the power supply voltage VDD and the node PA, and a control terminal of the transistor M2 is coupled to a node PB. On the other hand, the transistor M3 is coupled between the node PB and a reference ground terminal GND, and a control terminal of the transistor M3 receives the start signal ST provided by the shutdown detection circuit 150. The transistor M4 is coupled between the node PA and the reference ground terminal GND, and a control terminal of the transistor M4 receives an inverted start signal STB1.

In detail, an inverter INV1 receives the start signal ST, and generates the inverted start signal STB1 according to the start signal ST. The sensing circuit 510 generates a control signal CS1 by sensing a voltage difference between the start signal ST and the inverted start signal STB1. The switch SWB receives the control signal CS1, and executes a switching operation according to the control signal CS1. In the embodiment, when the start signal ST is enabled (to have a logic high level), the sensing circuit 510 may generate the control signal CS1 with the logic high level (corresponding to the control signal CS of FIG. 2). The switch SWB makes a source line DL to be coupled to the reference ground voltage VGND according to the control signal CS1 with the logic high level, and makes a source driving signal SOUT to be equal to the reference ground voltage VGND. On the contrary, when the start signal ST is disabled (to have a logic low level), the sensing circuit 510 may generate the control signal CS1 with the logic low level. The switch SWB makes the source line DL to receive a source driving signal SX for normal display according to the control signal CS1.

Figure 6:
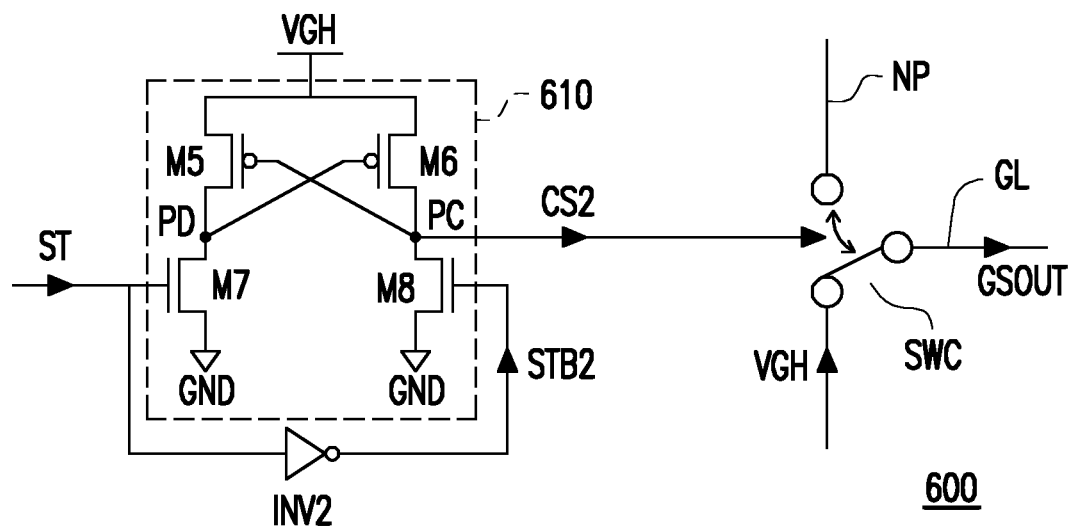
FIG. 6 is a circuit diagram of a level shifter according to an embodiment of the invention.

FIG. 6 is a circuit diagram of a level shifter according to an embodiment of the invention. In FIG. 6, the level shifter 600 may be an implementation of the level shifter 320 of FIG. 3. In the present embodiment, the level shifter 600 includes a sensing circuit 610 and a switch SWC, and the sending circuit 610 is composed of transistors M5-M8. The transistor M5 is coupled between the gate high voltage VGH and the transistor M7, and a control terminal of the transistor M5 is coupled to a node PC. The transistor M6 is coupled between the gate high voltage VGH and the node PC, and a control terminal of the transistor M6 is coupled to a node PD. On the other hand, the transistor M7 is coupled between the node PD and the reference ground terminal GND, and a control terminal of the transistor M7 receives the start signal ST provided by the shutdown detection circuit 150. The transistor M8 is coupled between the node PC and the reference ground terminal GND, and a control terminal of the transistor M8 receives an inverted start signal STB2.

In detail, an inverter INV2 receives the start signal ST, and generates the inverted start signal STB2 according to the start signal ST. The sensing circuit 610 generates a control signal CS2 by sensing a voltage difference between the start signal ST and the inverted start signal STB2. The switch SWC receives the control signal CS2, and executes a switching operation according to the control signal CS2. In the embodiment, when the start signal ST is enabled (to have the logic high level), the sensing circuit 610 may generate the control signal CS2 with the logic high level (corresponding to the control signal CS of FIG. 2). The switch SWC makes a gate line GL to receive the gate high voltage VGH with the high voltage pulse according to the control signal CS2 with the logic high level, such that the gate driver generates the gate scan signal GSOUT with the high voltage pulse. Comparatively, when the start signal ST is disabled (to have a logic low level), the sensing circuit 610 may generate the control signal CS2 with the logic low level. The switch SWC makes the gate line GL to receive a pulse signal NP for normal display according to the control signal CS2.

FIG. 7 is a circuit diagram of a voltage detection circuit according to an embodiment of the invention. The voltage detection circuit 700 includes voltage dividing circuits 710-720, operational amplifiers OP1-OP2 and a delay circuit 730. It should be noted that the voltage dividing circuit 710 of the embodiment may include resistors R1 and R2, where a first end of the resistor R1 is coupled to a detection voltage VA, and a second end of the resistor R1 is coupled to a negative input terminal of the operational amplifier OP1. Moreover, a first end of the resistor R2 is coupled to the negative input terminal of the operational amplifier OP1, and a second end of the resistor R2 is coupled to the reference ground terminal GND. On the other hand, the voltage dividing circuit 720 of the embodiment may include resistors R3 and R4, where a first end of the resistor R3 is coupled to the detection voltage VA, and a second end of the resistor R3 is coupled to a negative input terminal of the operational amplifier OP2. Moreover, a first end of the resistor R4 is coupled to the negative input terminal of the operational amplifier OP2, and a second end of the resistor R4 is coupled to the reference ground terminal GND.

In detail, in the present embodiment, the voltage dividing circuit 710 may receive the power supply voltage VDD, the input power VIN or the gate high voltage VGH to serve as the detection voltage VA. Moreover, the voltage dividing circuit 710 may perform a voltage dividing operation to the detection voltage VA to generate a divided voltage VP1. Then, the negative input terminal of the operational amplifier OP1 may receive the divided voltage VP1, and a positive input terminal of the operational amplifier OP1 may receive a reference voltage Vref, such that the operational amplifier OP1 generates an error signal ES according to the divided voltage VP1 and the reference voltage Vref. Then, the delay circuit 730 of the embodiment receives the error signal ES, and the delay circuit 730 generates a delay error signal DES according to the error signal ES.

On the other hand, the voltage dividing circuit 720 may receive the detection voltage VA, and the voltage dividing circuit 720 may perform a voltage dividing operation to the detection voltage VA to generate a divided voltage VP2. Then, the negative input terminal of the operational amplifier OP2 may receive the divided voltage VP2, and a positive input terminal of the operational amplifier OP2 may receive the delay error signal DES. In this way, the operational amplifier OP2 generates a detection result TR according to the divided voltage VP2 and the delay error signal DES.

It should be noted that the detection result TR of the embodiment may represents a variation state of the detection voltage VA in continuous time points, and through a plurality of detection results TR generated according to the power supply voltage VDD, the input power VIN and the gate high voltage VGH, it is determined whether the shutdown process needs to be started.

FIG. 8 is a flowchart illustrating a shutdown control method of a display device according to an embodiment of the invention. In step S810, the shutdown detection circuit detects a variation state of voltage values of a power supply voltage, an input power and a gate high voltage, and starts a shutdown process when the power supply voltage, the input power and the gate high voltage are all in a decreasing state. In step S820, in the shutdown process, a source driver makes source driving signals to be equal to a reference ground voltage. Then, a gate driver generates gate scan signals with a high voltage pulse. Finally, a power supply circuit makes a common voltage to be equal to the reference ground voltage.

Implementation details of the above steps have been described in detail in the aforementioned embodiments, and detail thereof is not repeated.

In summary, the display device of the invention starts the shutdown process by detecting the variation state of the voltage values of the power supply voltage, the input power and the gate high voltage within a time interval. In the shutdown process, the source driving signals are grounded by grounding the common voltage, and the gate scan signals have the high voltage pulse. In this way, the charges in the pixels may be effectively discharged, and when the display panel is turned on next time, image stability is maintained, so as to improve display quality.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display device, comprising:
    a display panel, having a plurality of pixels, and receiving a common voltage;
    a power supply circuit, receiving an input power, and generating a power supply voltage, a gate high voltage and the common voltage according to the input power;
    a gate driver, coupled to the display panel, and receiving the gate high voltage to generate a plurality of gate scan signals to drive the display panel;
    a source driver, coupled to the display panel, and providing a plurality of source driving signals to drive the display panel; and
    a shutdown detection circuit, coupled to the power supply circuit, the gate driver and the source driver, and configured to detect a variation state of voltage values of the power supply voltage, the input power and the gate high voltage, and starting a shutdown process when the voltage values of the power supply voltage, the input power and the gate high voltage are all in a decreasing state, wherein in the shutdown process, the source driver makes the source driving signals to be equal to a reference ground voltage, the gate driver generates the gate scan signals with a high voltage pulse, and the power supply circuit makes the common voltage to be equal to the reference ground voltage, wherein the shutdown detection circuit comprises at least one voltage detection circuit, and the at least one voltage detection circuit comprises:
- a first voltage dividing circuit, receiving the power supply voltage, the input power and the gate high voltage to serve as a detection voltage, and dividing the detection voltage to generate a first divided voltage;
- a first operational amplifier, receiving the first divided voltage and a reference voltage, and generating an error signal;
- a delay circuit, receiving the error signal, and delaying the error signal to generate a delay error signal;
- a second voltage dividing circuit, receiving the detection voltage, and dividing the detection voltage to generate a second divided voltage; and
- a second operational amplifier, receiving the second divided voltage and the delay error signal to generate a detection result.

2. The display device as claimed in claim 1, further comprising:
a multiplexer, disposed on the display panel, and having a plurality of switched coupled to the source driver, wherein in the shutdown process, the switches are kept in a complete turn-on state.

3. The display device as claimed in claim 1, wherein the shutdown detection circuit detects the power supply voltage, the input power and the gate high voltage at a first time point to respectively obtain a first voltage, a second voltage and a third voltage, the shutdown detection circuit detects the power supply voltage, the input power and the gate high voltage at a second time point to respectively obtain a fourth voltage, a fifth voltage and a sixth voltage, and the shutdown detection circuit respectively subtracts the first voltage, the second voltage and the third voltage by the fourth voltage, the fifth voltage and the sixth voltage, and generates a start signal to start the shutdown process,
wherein the first time point is before the second time point.

4. The display device as claimed in claim 3, wherein the shutdown detection circuit respectively subtracts the first voltage, the second voltage and the third voltage by the fourth voltage, the fifth voltage and the sixth voltage to respectively generate a first voltage difference, a second voltage difference and a third voltage difference, and starts the shutdown process when the first voltage difference is greater than a first threshold, the second voltage difference is greater than a second threshold, and the third voltage difference is greater than a third threshold.

5. The display device as claimed in claim 3, wherein the first voltage, the second voltage and the third voltage are respectively smaller than standard voltage values of the power supply voltage, the input power and the gate high voltage.

6. The display device as claimed in claim 3, wherein the source driver receives the start signal, and inverts the start signal to generate an inverted start signal, and senses a voltage difference of the start signal and the inverted start signal to generate a control signal, and the source driver generates the source driving signals equal to the reference ground voltage according to the control signal.

7. The display device as claimed in claim 3, wherein the power supply circuit comprises:
- a common voltage generator, having an output terminal to generate a supply voltage; and
- a switch, coupled between an output terminal of the common voltage generator, a common voltage output pin and the reference ground voltage, wherein the switch is controlled by the start signal, and makes the common voltage output pin to be coupled to the reference ground voltage when the shutdown process is started.

8. The display device as claimed in claim 1, wherein the gate driver provides each of the gate scan signals with the high voltage pulse to make the pixels to perform a discharge operation.

9. The display device as claimed in claim 1, wherein the power supply circuit comprises:
- a voltage generator, receiving the input power, and generates the gate high voltage and a gate low voltage according to the input power; and
- a level shifter, coupled to the voltage generator, receiving the gate high voltage and the gate low voltage, and generating a gate driving pulse signal and a multiplex control pulse signal,
wherein the level shifter respectively provides the gate driving pulse signal and the multiplex control pulse signal to the gate driver and a multiplexer on the display panel.

10. The display device as claimed in claim 9, wherein the level shifter receives the start signal, and inverts the start signal to generate an inverted start signal, and senses a voltage difference of the start signal and the inverted start signal to generate a control signal,
wherein the level shifter provides the control signal to the gate driver, and makes the gate driver to generate each of the gate scan signals with the high voltage pulse.

11. A shutdown control method of a display device, comprising:
detecting a variation state of voltage values of a power supply voltage, an input voltage and a gate high voltage, and starting a shutdown process when the voltage values of the power supply voltage, the input power and the gate high voltage are all in a decreasing state; and
in the shutdown process, making source driving signals to be equal to a reference ground voltage, generating each of gate scan signals with a high voltage pulse, and making a common voltage to be equal to the reference ground voltage,
wherein the power supply voltage, the gate high voltage and the common voltage are generated according to the input power,
wherein the step of detecting the variation state of voltage values of the power supply voltage, the input voltage and the gate high voltage comprises:
receiving the power supply voltage, the input power and the gate high voltage to serve as a detection voltage, and generating a first divided voltage by dividing the detection voltage;

generating an error signal by a first operation amplifier according to the first divided voltage and a reference voltage;

generating a delay error signal delaying the error signal;

generating a second divided voltage by dividing the detection voltage; and generating a detection result by a second operation amplifier according to the second divided voltage and the delay error signal.

12. The shutdown control method of the display device as claimed in claim 11, further comprising:

in the shutdown process, making a plurality of switches in a multiplexer disposed on a display panel to be kept in a complete turn-on state.

13. The shutdown control method of the display device as claimed in claim 11, wherein the step of detecting the variation state of voltage values of the power supply voltage, the input voltage and the gate high voltage, and starting the shutdown process when the voltage values of the power supply voltage, the input power and the gate high voltage are all in the decreasing state comprises:

detecting the power supply voltage, the input power and the gate high voltage at a first time point to respectively obtain a first voltage, a second voltage and a third voltage;

detecting the power supply voltage, the input power and the gate high voltage at a second time point to respectively obtain a fourth voltage, a fifth voltage and a sixth voltage; and respectively subtracting the first voltage, the second voltage and the third voltage by the fourth voltage, the fifth voltage and the sixth voltage, so as to generate a start signal to start the shutdown process.

14. The shutdown control method of the display device as claimed in claim 13, wherein the step of respectively subtracting the first voltage, the second voltage and the third voltage by the fourth voltage, the fifth voltage and the sixth voltage, so as to generate the start signal to start the shutdown process comprises:

respectively subtracting the first voltage, the second voltage and the third voltage by the fourth voltage, the fifth voltage and the sixth voltage to respectively generate a first voltage difference, a second voltage difference and a third voltage difference; and starting the shutdown process when the first voltage difference is greater than a first threshold, the second voltage difference is greater than a second threshold, and the third voltage difference is greater than a third threshold.

15. The shutdown control method of the display device as claimed in claim 13, wherein the first voltage, the second voltage and the third voltage are respectively smaller than standard voltage values of the power supply voltage, the input power and the gate high voltage.

* * * * *